United States Patent
Lee et al.

(10) Patent No.: US 7,102,926 B2
(45) Date of Patent: Sep. 5, 2006

(54) INTEGRATED CIRCUIT MEMORY DEVICES INCLUDING PROGRAMMED MEMORY CELLS AND PROGRAMMABLE AND ERASABLE MEMORY CELLS

(75) Inventors: Byeong-hoon Lee, Seoul (KR); Chil-hee Chung, Seoul (KR)

(73) Assignee: Samsung Electronics Co., Ltd., (KR)

( * ) Notice: Subject to any disclaimer, the term of this patent is extended or adjusted under 35 U.S.C. 154(b) by 106 days.

(21) Appl. No.: 10/880,800

(22) Filed: Jun. 30, 2004

(65) Prior Publication Data
US 2005/0007822 A1 Jan. 13, 2005

(30) Foreign Application Priority Data
Jul. 11, 2003 (KR) ................ 10-2003-0047417

(51) Int. Cl.
*G11C 16/04* (2006.01)
(52) U.S. Cl. .............. 365/185.11; 365/94; 365/185.2
(58) Field of Classification Search ........... 365/185.11, 365/94, 185.2
See application file for complete search history.

(56) References Cited

U.S. PATENT DOCUMENTS

| 4,811,303 A | 3/1989 | Hirai | |
|---|---|---|---|
| 5,553,016 A | 9/1996 | Takebuchi | |
| 5,867,443 A | 2/1999 | Linderman | |
| 6,493,271 B1 * | 12/2002 | Matsubara et al. | .... 365/185.33 |
| 6,570,790 B1 * | 5/2003 | Harari | ........... 365/185.11 |
| 6,620,682 B1 * | 9/2003 | Lee et al. | ........... 438/257 |

FOREIGN PATENT DOCUMENTS

| EP | 0 398 067 A2 | 11/1990 |
|---|---|---|
| EP | 0 902 477 A1 | 3/1999 |
| JP | 61-214559 A | 9/1986 |
| JP | 5190788 | 7/1993 |
| JP | 6168599 | 6/1994 |
| WO | WO 2004/070730 A1 | 8/2004 |

OTHER PUBLICATIONS

Rapport de Recherche Préliminaire (Search Report), FR 04 07708, May 23, 2005.
Notice to Submit a Response for Korean patent application No. 10-2003-0047417 mailed on Apr. 29, 2005.

* cited by examiner

*Primary Examiner*—Huan Hoang
(74) *Attorney, Agent, or Firm*—Myers Bigel Sibley & Sajovec, P.A.

(57) ABSTRACT

An integrated circuit memory device includes programmed memory cells and programmable and erasable memory cells. The memory device includes a first memory array block in which programmed memory cells are arranged and a second memory array block in which programmable and erasable memory cells are arranged. The programmed memory cells in the first memory array block may be programmed with predetermined data during a semiconductor manufacturing process, and may be mask read-only memory (ROM) cells. The programmable and erasable memory cells in the second memory array block may be programmed or erased with predetermined data after the semiconductor manufacturing process, and may be electrically erasable and programmable read-only memory (EEPROM) cells or flash memory cells.

22 Claims, 2 Drawing Sheets

INTEGRATED CIRCUIT MEMORY DEVICES INCLUDING PROGRAMMED MEMORY CELLS AND PROGRAMMABLE AND ERASABLE MEMORY CELLS

RELATED APPLICATION

This application claims the benefit of Korean Patent Application No. 2003-47417, filed on Jul. 11, 2003, the disclosure of which is hereby incorporated herein in its entirety as if set forth fully herein.

FIELD OF THE INVENTION

The present invention relates to integrated circuit (semiconductor) memory devices, and more particularly, to nonvolatile integrated circuit memory devices including memory cells that are programmed during a semiconductor device manufacturing process and integrated circuit memory devices including memory cells that are programmable and erasable after a semiconductor device manufacturing process.

BACKGROUND OF THE INVENTION

In general, software for operating a system-on-chip (SOC) and/or other software may be stored in read-only memories (ROMs) that is called firmware. The ROMs store program codes corresponding to the firmware in ROM cells in a manufacturing process, that is, in a semiconductor wafer processing step. For example, mask ROMs are programmed to be "on" or "off" in a channel region of a transistor included in a memory cell, depending on whether an implant process is performed in accordance with a program code. Accordingly, the mask ROMs generally can store data just one time. Since the mask ROMs have no write circuit, their configuration may be simple. Moreover, since the mask ROMs may not use a special process for a cell structure, the mask ROMs may be low or lowest in terms of manufacturing costs. The design of mask ROMs is well known to those having skill in the art and need not be described further herein.

Programmable and erasable memory devices also have been developed. These devices can be used to correct the firmware even after the SOCs have been made. A representative programmable and erasable memory device is an electrically erasable and programmable read-only memory (EEPROM). An EEPROM generally includes a transistor which has a control gate and a floating gate formed in a channel region between a source and a drain. A threshold voltage of the transistor is controlled by the amount of charge in the floating gate. That is, when a turn-on voltage of the transistor which conducts between the source and the drain is applied to the control gate, the turn-on voltage is controlled by the level of the charge in the floating gate. The transistor is programmed to be either "on" or "off" by electrons which are trapped on the floating gate through a gate oxide layer from the channel region in a substrate.

Whether the EEPROM cell transistor is programmed to be "on" or "off" is determined by detecting the level of current flowing between the source and the drain after an operating voltage is applied to the control gate and both ends of the source and the drain. When a proper amount of current is applied to the source and drain, and the control gate of the programmed transistor, charges are transferred to the drain from the floating gate by a tunneling mechanism, such that the EEPROMs can be electrically erased. Particularly, EEPROMs which can erase all memory cells or memory cells of a specific group at a time are called flash memories. The design of EEPROMs and flash memory devices are well known to those having skill in the art and need not be described further herein.

A conventional process of producing SOCs will now be described. When developing programs for the SOCs, EEPROMs or flash memories may be used since the EEPROMs or flash memories can correct firmware even after integrated circuit chips have already been manufactured. When producing the SOCs, the developed programs may be stored in ROMs. Moreover, as a variety of SOCs have been developed, there may be many cases that some products share firmware but some other products use different firmware. Accordingly, both ROM chips and EEPROM chips or flash memory chips may be used in the SOCs, so that the shared firmware can be stored in the ROMs and different firmware can be stored in the EEPROMs or the flash memories.

SUMMARY OF THE INVENTION

Embodiments of the present invention provide integrated circuit memory devices including memory cells that are programmed during a semiconductor manufacturing process of the integrated circuit memory device and memory cells that are programmable and erasable after the semiconductor manufacturing process of the integrated circuit memory devices. For example, a combined ROM and EEPROM chip may be provided in some embodiments. A plurality of signal lines such as bit lines, can extend across the ROM and EEPROM memory cells in some embodiments.

According to some embodiments of the present invention, there is provided an integrated circuit memory device that includes a first memory array block comprising programmed memory cells, and a second memory array block comprising programmable and erasable memory cells. In some embodiments, a plurality of common signal lines, such as bit lines, extend across the first memory array block and the second memory array block.

In some embodiments, the programmed memory cells in the first memory array block, which are programmed with predetermined data during a semiconductor manufacturing process, may comprise mask read-only memory (ROM) cells. The programmable and erasable memory cells in the second memory array block, which are programmed or erased with predetermined data after the semiconductor manufacturing process, may comprise electrically erasable and programmable read-only memory (EEPROM) cells or flash memory cells.

According to other embodiments of the present invention, there is provided an integrated circuit memory device that includes a first memory array block comprising programmed memory cells and a second memory array block comprising programmable and erasable memory cells. A dummy memory array block is interposed between the first memory array block and the second memory array block. The dummy memory array block comprises inactive memory cells. The dummy memory block can be used to at least partially compensate for height differences between the first and second memory array blocks.

The inactive memory cells in the dummy memory array block may be the same kind of memory cells as the programmed memory cells in the first memory array block or the same kind of memory cells as the programmable and erasable memory cells in the second memory array block. The inactive memory cells adjacent to the first memory array block may be the same kind of memory cells as the programmed memory cells in the first memory array block, and the inactive memory cells adjacent to the second memory array block may be the same kind of memory cells as the programmable and erasable memory cells in the second memory array block.

According to still other embodiments of the present invention, an integrated circuit memory device includes (n+m) word lines, a first address decoder that is configured to receive and decode first addresses, and a word line driver that is configured to select a predetermined word line among the (n+m) word lines and to drive the predetermined word line at a predetermined voltage level in response to the decoded first addresses. Also provided are (n+m)/2 source lines, a second address decoder that is configured to receive and decode second addresses and a source line driver that is configured to select a predetermined source line among the (n+m)/2 source lines and to drive the predetermined source line at a predetermined voltage level in response to the decoded second addresses. Also provided are i bit lines. A first memory array block is provided, that comprises programmed memory cells at intersecting points between n word lines among the (n+m) word lines and the i bit lines. A second memory array block also is provided, comprising programmable and erasable memory cells at intersecting points between m word lines among the (n+m) word lines and the i bit lines. A bit line decoder is configured to select a predetermined bit line among the i bit lines and to output memory cell data of the first and second memory array blocks in response to the decoded first addresses.

According to yet other embodiments of the present invention, an integrated circuit memory device includes (n+m) word lines and I dummy word lines. A first address decoder is configured to receive and decode first addresses. A word line driver is configured to select a predetermined word line among the (n+m) word lines and to drive the predetermined word line at a predetermined voltage level in response to the decoded first addresses. Also provided are (n+m)/2 source lines and I/2 dummy source lines. A second address decoder is configured to receive and decode second addresses. A source line driver is configured to select a predetermined source line among the (n+m)/2 source lines and to drive the predetermined source line at a predetermined voltage level in response to the decoded second addresses. Also provided are i bit lines. A first memory array block is provided, comprising programmed memory cells at intersecting points between n word lines among the (n+m) word lines and the i bit lines. A second memory array block is provided, comprising programmable and erasable memory cells at intersecting points between m word lines among the (n+m) word lines and the i bit lines. A dummy memory array block is interposed between the first memory array block and the second memory array block, comprising inactive memory cells at intersecting points between the I dummy word lines and the i bit lines. The inactive memory cells are also connected to the I/2 dummy source lines. Finally, a bit line decoder is configured to select a predetermined bit line among the i bit lines and to output memory cell data of the first and second memory array blocks in response to the decoded first addresses.

Accordingly, since verified basic operating programs may be stored in the first memory array block during the manufacturing process and corrected or added operating programs may be stored in the second memory array block after the manufacturing process, in some embodiments of the present invention, the total time taken to store programs can be reduced and programs can be easily corrected or added.

Since the dummy memory array block can reduce a difference in height between the first memory array block and the second memory array block, a process yield can be improved in some embodiments of the present invention. Since some firmware programs shared by a plurality of SOCs may be stored in the first memory array block and some firmware programs individually applied to each SOC may be stored in the second memory array block, SOCs employing memory devices of some embodiments of the present invention can allow a short time-to-market and/or allow enhanced product competitiveness.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various embodiments, elements, components, regions, layers and/or sections, these embodiments, elements, components, regions, layers and/or sections should not be limited by these terms. These terms are only used to distinguish one embodiment, element, component, region, layer or section from another region, layer or section. Thus, a first embodiment, region, layer or section discussed below could be termed a second embodiment, region, layer or section, and, similarly, a second embodiment, region, layer or section could be termed a first embodiment, region, layer or section without departing from the teachings of the present invention. The term "directly" means that there are no intervening elements. Finally, as used herein, the term "and/or" includes any and all combinations of one or more of the associated listed items.

Figure 1:
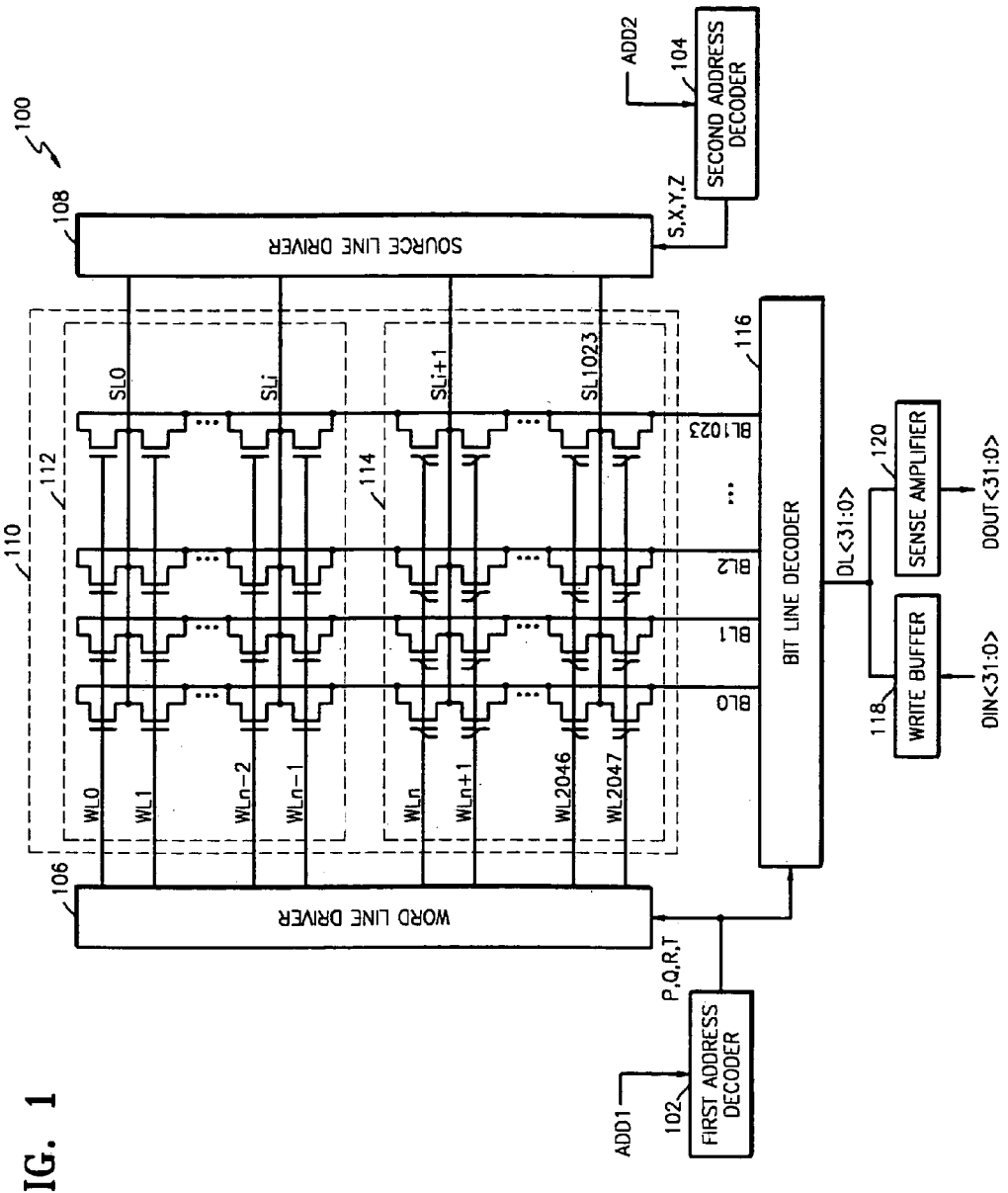
FIG. 1 is a circuit diagram of a memory device according to first embodiments of the present invention.

FIG. 1 is a circuit diagram of an integrated circuit memory device according to first embodiments of the present invention. Referring to FIG. 1, an integrated circuit (chip) memory device 100 includes first and second address decoders 102 and 104, a word line driver 106, a source line driver 108, a memory cell array block 110, a bit line decoder 116, a write buffer 118, and a sense amplifier 120. The first address decoder 102 receives and decodes first address signals ADD1 and transmits the decoded first address signals ADD1 to the word line driver 106 and the bit line decoder 116. The word line driver 106 selects a predetermined word line WL among a plurality of word lines, for example, 2048 word lines, in response to the decoded first address signals P, Q, R, and T. An adequate voltage is applied to the selected word line WL according to an operating mode of the memory device 100.

The memory cell array block 110 includes a first memory array block 112 and a second memory array block 114. The first and second memory array blocks 112 and 114 include memory cells which are arranged at intersecting points between the word lines WLs and the bit lines BLs, for example, 2048 word lines and 2048 bit lines. In FIG. 1, the memory cells in the first memory array block 112 are NOR-type read-only memory (ROM) cells and the memory cells in the second memory array block 114 are NOR-type flash memory cells. In the first memory array block 112, the ROM cells are arranged at intersecting points of n word lines WL and the 2048 bit lines BL. In the second memory array block 114, the flash memory cells are arranged at intersecting points between (2048-n) word lines and the 2048 bit lines. The present embodiment exemplarily shows that the first memory array block 112 includes the ROM cells and the second memory array block 114 includes the flash memory cells. Accordingly, the first memory array block 112 can be used to store programs during a semiconductor manufacturing process and the second memory array block 114 can be used to store programs after the semiconductor manufacturing process. It will also be understood that other types of programmed and programmable and erasable memory cells may be used, and three or more types of cells may be used in a single integrated circuit 100.

The second address decoder 104 decodes second address signals ADD2, and the source line driver 108 selects a predetermined source line SL among a plurality of source lines, for example, 1024 source lines, in response to the decoded second address signals S, X, Y, and Z. A ground voltage is applied to the selected predetermined source line SL.

The bit line decoder 116 selects a predetermined bit line BL among a plurality of bit lines, for example, 1024 bit lines, in response to the decoded first address signals P, Q, R, and T. Bit lines BL0, BL1, BL2, . . . , BL 1023 are selectively connected to a data line DL<31:0> through the bit line decoder 116. The bit lines provide an embodiment of a plurality of common signal lines that extend across the first memory array block 112 and the second memory array block 114. Other common signal lines also may be provided, such as word lines, source lines and/or data lines.

The write buffer 118 receives a data input signal DIN<31:0> and transmits the received data input signal DIN<31:0> to the data line DL<31:0>. The sense amplifier 120 amplifies the memory cell data transmitted to the data line DL<31:0> and sends the amplified memory cell data as a data output signal DOUT<31:0>.

In an integrated circuit memory device 100 constructed as above, the first memory array block 112 may store already verified programs and the second memory array block 114 may store newly added programs or unverified programs. In some embodiments, most programs for basic operations may be programmed in the first memory array block 112 during a wafer processing step and programs for adding functions or changing operations may be programmed in the second memory array block 114 after the completion of the wafer processing steps. Accordingly, a time consumed in storing programs after the semiconductor manufacturing process can be reduced, and programs can be added and corrected.

When an integrated circuit memory device 100 according to some embodiments of the invention is employed by a system-on-chip (SOC), some firmware programs shared by many SOCs may be stored in the first memory array block 112 and some firmware programs individually applied to each SOC may be stored in the second memory array block 114. Consequently, an SOC according to some embodiments can allow improved product competitiveness due to a short time-to-market.

Figure 2:
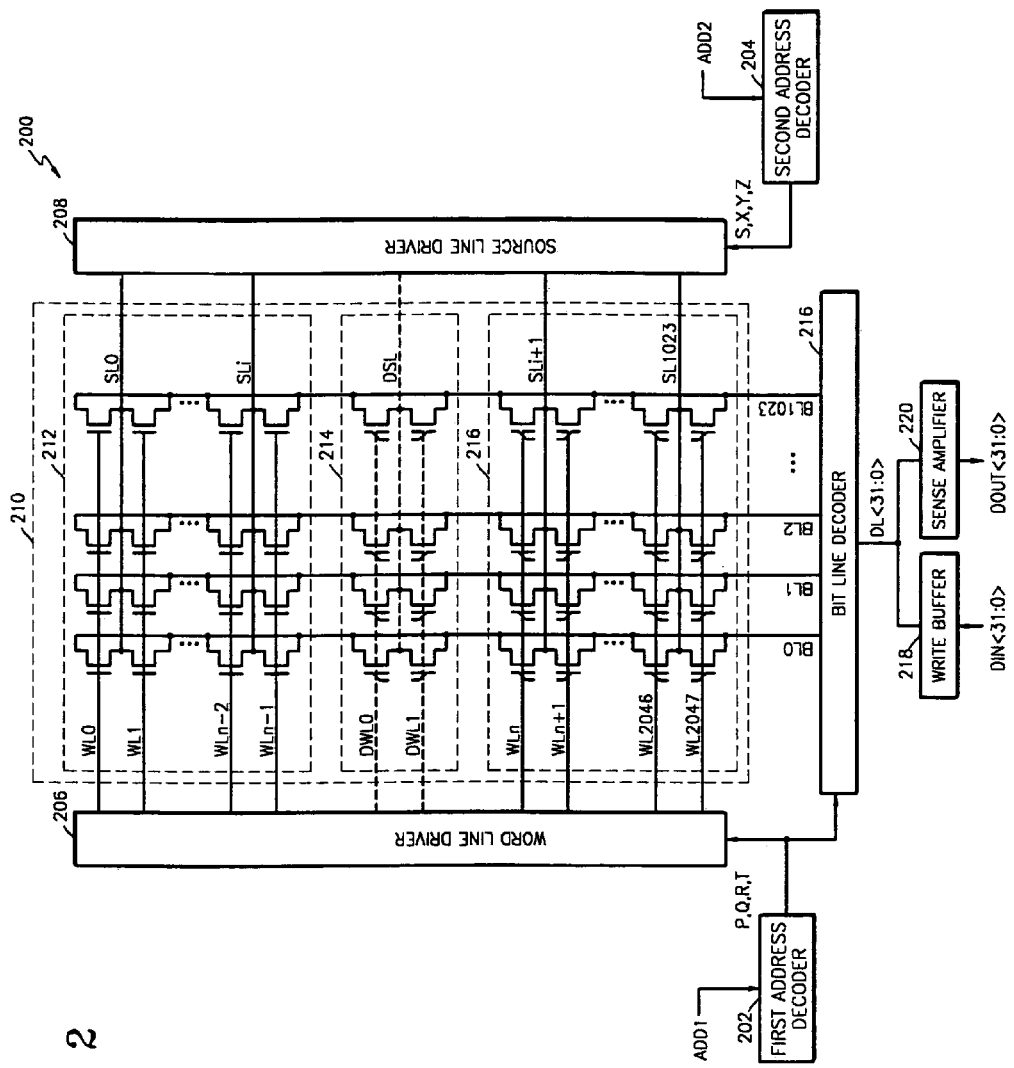
FIG. 2 is a circuit diagram of a memory device according to second embodiments of the present invention.

FIG. 2 is a circuit diagram of an integrated circuit memory device according to second embodiments of the present invention. Referring to FIG. 2, an integrated circuit memory device 200 further includes a dummy memory array block 214 in a memory array block 210, as compared with the memory device 100 of FIG. 1.

The dummy memory array block 214 is interposed between a first memory array block 212 and a second memory array block 216 and can reduce a difference in height between the first memory array block 212 and the second memory array block 216. That is, since ROM cells arranged in the first memory array block 212 may include one layer of gates whereas electrically erasable and programmable read-only memory (EEPROM) cells or flash memory cells arranged in the second memory array block 216 may include two layers of gates, i.e., floating gates and control gates, a great difference in height may be present between the first memory array block 212 and the second memory array block 216. The great difference in height may cause metal to be cut off in a subsequent process after a gate processing step, particularly, in a metal depositing process for forming bit lines BL.

Therefore, the dummy memory array block 214 is added in some embodiments of the present invention, which can reduce the potentially great difference in height between the first memory array block 212 and the second memory array block 216. Dummy (inactive) cells arranged in the dummy memory array block 214 may be the same kind of ROM cells as those in the first memory array block 212, the same kind of EEPROM cells or flash memory cells as those in the second memory array block 216, or combined cells of ROM cells, EEPROM cells and flash memory cells. In some embodiments, when combined cells are used, the inactive memory cells adjacent to the first memory array block comprise a same kind of memory cell as the programmed memory cells in the first memory array block, and the inactive memory cells adjacent to the second memory array block comprise a same kind of memory cell as the memory cells in the second memory array block.

In the dummy memory array block 214, the EEPROM cells or flash memory cells are arranged at intersecting points between dummy word lines DWL0 and DWL1, and bit lines BL0, BL1, BL2, . . . , BL 1023. Since the dummy word lines DWL0 and DWL1 are not decoded by received first address signals ADD1 and dummy source lines DSL are not decoded by second address signals ADD2, the dummy cells are not selected, i.e. they are inactive.

In some embodiments, the dummy word lines DWL0 and DWL1 and the dummy source lines DSL can be either floated or connected to a ground voltage VSS by a word line driver 206 and a source line driver 208.

Since integrated circuit memory devices 200 according to some embodiments can employ the dummy memory array block 214 to reduce the difference in height between the first memory array block 212 and the second memory array block 216, a process yield can be improved. Finally, it will be understood that although the memory cells described herein are NOR-type memory cells, the memory cells can be NAND-types and/or other types.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An integrated circuit memory device comprising:
   a first memory array block comprising programmed memory cells in an integrated circuit substrate;

a second memory array block comprising programmable and erasable memory cells in the integrated circuit substrate; and a dummy memory array block in the integrated circuit substrate interposed between the first memory array block and the second memory array block, comprising inactive memory cells.

2. The memory device of claim 1, wherein the first memory array block is programmed with predetermined data during manufacturing of the memory device.

3. The memory device of claim 2, wherein the programmed memory cells in the first memory array block comprise mask read-only memory cells.

4. The memory device of claim 1, wherein the second memory array block is programmed or erased with predetermined data after manufacturing the memory device.

5. The memory device of claim 4, wherein the programmable and erasable memory cells in the second memory array block comprise electrically erasable and programmable read-only memory cells.

6. The memory device of claim 4, wherein the programmable and erasable memory cells in the second memory array block comprise flash memory cells.

7. The memory device of claim 1, wherein the inactive memory cells in the dummy memory may block comprise a same kind of memory cell as the programmed memory cells in the first memory array block.

8. The memory device of claim 1, wherein the inactive memory cells in the dummy memory array block comprise a same kind of memory cell as the programmable and erasable memory cells in the second memory array block.

9. The memory device of claim 1, wherein the inactive memory cells adjacent to the first memory array block comprise a same kind of memory cell as the programmed memory cells in the first memory array block, and the inactive memory cells adjacent to the second memory array block comprise a same kind of memory cell as the memory cells in the second memory array block.

10. An integrated circuit memory device comprising:
(n+m) word lines;
I dummy word lines;
a first address decoder that is configured to receive and decode first addresses;
a word line driver that is configured to select a predetermined word line among the (n+m) word lines and to drive the predetermined word line at a predetermined voltage level in response to the decoded first addresses;
(n+m)/2 source lines;
I/2 dummy source lines;
a second address decoder that is configured to receive and decode second addresses;
a source line driver that is configured to select a predetermined source line among the (n+m)/2 source lines and to drive the predetermined source line at a predetermined voltage level in response to the decoded second addresses;
i bit lines;
a first memory array block comprising programmed memory cells at intersecting points between n word lines among the (n+m) word lines and the i bit lines;

a second memory array block comprising programmable and erasable memory cells at intersecting points between m word lines among the (n+m) word lines and the i bit lines;

a dummy memory array block interposed between the first memory array block and the second memory array block, comprising inactive memory cells at intersecting points between the I dummy word lines and the i bit lines, the inactive memory cells being connected to the I/2 dummy source lines; and a bit line decoder that is configured to select a predetermined bit line among the i bit lines and to output memory cell data of the first and second memory array blocks in response to the decoded first addresses.

11. The memory device of claim 10, wherein the I dummy word lines are not selected by the word line driver.

12. The memory device of claim 10, wherein the I/2 dummy source lines are not selected by the source line driver.

13. The memory device of claim 10, wherein the I dummy word lines and the I/2 dummy source lines are either floated or connected to a ground voltage.

14. The memory device of claim 10, wherein the first memory array block is programmed with predetermined data during manufacturing of the memory device.

15. The memory device of claim 10, wherein the programmed memory cells in the first memory array block comprise mask read-only memory cells.

16. The memory device of claim 10, wherein the second memory array block is programmed or erased with predetermined data after manufacturing the memory device.

17. The memory device of claim 16, wherein the programmable and erasable memory cells in the second memory array block comprise electrically erasable and programmable read-only memory cells.

18. The memory device of claim 16, wherein the programmable and erasable memory cells in the second memory array block comprise flash memory cells.

19. The memory device of claim 10, wherein the inactive memory cells in the dummy memory array block comprise a same kind of memory cell as the programmed memory cells in the first memory may block.

20. The memory device of claim 10, wherein the inactive memory cells in the dummy memory array block comprise a same kind of memory cell as the programmable and erasable memory cells in the second memory array block.

21. The memory device of claim 10, wherein the inactive memory cells adjacent to the first memory array block comprise a same kind of memory cell as the programmed memory cells in the first memory array block, and the inactive memory cells adjacent to the second memory array block comprise a same kind of memory cell as the programmable and erasable memory cells in the second memory array block.

22. The memory device of claim 10, wherein the memory cells in the first and second memory array blocks and the dummy memory array block comprise NOR-type memory cells.

* * * * *